(12) United States Patent
Li et al.

(10) Patent No.: US 7,446,010 B2
(45) Date of Patent: Nov. 4, 2008

(54) METAL/SEMICONDUCTOR/METAL (MSM) BACK-TO-BACK SCHOTTKY DIODE

(75) Inventors: Tingkai Li, Vancouver, WA (US); Sheng Teng Hsu, Camas, WA (US); David R. Evans, Beaverton, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 266 days.

(21) Appl. No.: 11/435,669

(22) Filed: May 17, 2006

(65) Prior Publication Data

US 2007/0015330 A1 Jan. 18, 2007

Related U.S. Application Data

(63) Continuation-in-part of application No. 11/184,660, filed on Jul. 18, 2005, now Pat. No. 7,303,971, and a continuation-in-part of application No. 11/216,398, filed on Aug. 31, 2005, now Pat. No. 7,271,081, and a continuation-in-part of application No. 11/295,778, filed on Dec. 7, 2005.

(51) Int. Cl.
*H01L 21/8222* (2006.01)
(52) U.S. Cl. .................. 438/328; 438/238; 438/381; 257/E21.304; 257/E21.645; 257/E21.646; 257/E21.657; 257/E21.659; 257/E27.004; 257/E27.071
(58) Field of Classification Search ............... 438/328, 438/238, 381, 217, 289, 680, 682, 738
See application file for complete search history.

(56) References Cited

U.S. PATENT DOCUMENTS

| | | | | | |
|---|---|---|---|---|---|
| 5,534,711 | A | * | 7/1996 | Ovshinsky et al. | 257/3 |
| 5,687,112 | A | * | 11/1997 | Ovshinsky | 365/163 |
| 6,331,944 | B1 | * | 12/2001 | Monsma et al. | 365/171 |
| 6,753,561 | B1 | * | 6/2004 | Rinerson et al. | 257/295 |

* cited by examiner

*Primary Examiner*—David Nhu
(74) *Attorney, Agent, or Firm*—Law Office of Gerald Maliszewski; Gerald Maliszewski (57) ABSTRACT

A method is provided for forming a metal/semiconductor/metal (MSM) back-to-back Schottky diode from a silicon (Si) semiconductor. The method deposits a Si semiconductor layer between a bottom electrode and a top electrode, and forms a MSM diode having a threshold voltage, breakdown voltage, and on/off current ratio. The method is able to modify the threshold voltage, breakdown voltage, and on/off current ratio of the MSM diode in response to controlling the Si semiconductor layer thickness. Generally, both the threshold and breakdown voltage are increased in response to increasing the Si thickness. With respect to the on/off current ratio, there is an optimal thickness. The method is able to form an amorphous Si (a-Si) and polycrystalline Si (polySi) semiconductor layer using either chemical vapor deposition (CVD) or DC sputtering. The Si semiconductor can be doped with a Group V donor material, which decreases the threshold voltage and increases the breakdown voltage.

15 Claims, 11 Drawing Sheets

Fig. 3C a-Si THICKNESS OF 20nm

Fig. 3D a-Si THICKNESS OF 25nm

Fig. 3E a-Si THICKNESS OF 30nm

Fig. 3F a-Si THICKNESS OF 50nm

Fig. 4

Fig. 5A a-Si THICKNESS OF 30nm

Fig. 5B

WAFER #3508, DC-SPUTTERING, AS IMPLANTATION 30keV, 1E12, 500C FOR 10 m, TiN(150nm)/A-Si(50nm)/TiN(150nm)/Pt/Si, Pt TO TiN TOP ELECTRODES, AREA: 100X100μm a-Si THICKNESS OF 50nm

Fig. 5C

WAFER #2913, DC-SPUTTERING, AS IMPLANTATION 30keV, 1E12, 500C FOR 10 m, TiN(150nm)/A-Si(65nm)/TiN(150nm)/Pt/Si, Pt TO TiN TOP ELECTRODES, AREA: 100X100μm a-Si THICKNESS OF 65nm

Fig. 5D

WAFER #2970, DC-SPUTTERING, AS IMPLANTATION 30keV, 1E12, 500C FOR 10 m, TiN(150nm)/A-Si(80nm)/TiN(150nm)/Pt/Si, Pt TO TiN TOP ELECTRODES, AREA: 100X100μm a-Si THICKNESS OF 80nm

WAFER #3481, DC-SPUTTERING Si, 1.2μm, Pt(150nm)/
A-Si(1.2μm)/Pt(150nm)/Si, BOTTOM (PT) TO TOP (Pt) ELECTRODES,
AREA: 200X200μm

LARGE APPLIED VOLTAGE RANGE

Fig. 7B

WAFER #3481, DC-SPUTTERING Si, 1.2μm, Pt(150nm)/
A-Si(1.2μm)/Pt(150nm)/Si, BOTTOM (PT) TO TOP (Pt) ELECTRODES,
AREA: 200X200μm

SMALL APPLIED VOLTAGE RANGE

Fig. 8A WAFER #3481, DC-SPUTTERING Si, 1.2μm, Pt(150nm)/ A-Si(1.2μm)/Pt(150nm)/Si, Si SUBSTRATE TO TOP (Pt) ELECTRODES, AREA: 200X200μm

LARGE APPLIED VOLTAGE RANGE

Fig. 8B WAFER #3481, DC-SPUTTERING Si, 1.2μm, Pt(150nm)/ A-Si(1.2μm)/Pt(150nm)/Si, Si SUBSTRATE TO TOP (Pt) ELECTRODES, AREA: 200X200μm

SMALL APPLIED VOLTAGE RANGE

METAL/SEMICONDUCTOR/METAL (MSM) BACK-TO-BACK SCHOTTKY DIODE

RELATED APPLICATIONS

This application is a Continuation-in-Part of a patent application entitled, MSM BINARY SWITCH MEMORY DEVICE, invented by Sheng Teng Hsu et al., Ser. No. 11/184,660, filed Jul. 18, 2005 now U.S. Pat. No. 7,303,971.

This application is a Continuation-in-Part of a patent application entitled, METAL/ZnOx/METAL CURRENT LIMITER, invented by Tingkai Li et al., Ser. No. 11/216,398, filed Aug. 31, 2005 now U.S. Pat. No. 7,271,081.

This application is a Continuation-in-Part of a patent application entitled, CROSSPOINT RESISTOR MEMORY DEVICE WITH BACK-TO-BACK SCHOTTKY DIODES, invented by Sheng Teng Hsu et al., Ser. No. 11/295,778, filed Dec. 7, 2005.

The above-mentioned applications are expressly incorporated herein by reference, and both claim priority under 35 U.S.C. §120.

BACKGROUND OF THE INVENTION

1. Field of the Invention

This invention generally relates to an integrated circuit (IC) fabrication process and, more particularly, to an MSM device, made with a silicon semiconductor, that acts as a back-to-back Schottky diode.

2. Description of the Related Art

A cross-point memory array is a matrix of memory elements, with electrical contacts arranged along x-axes (i.e., word lines) and along y-axes (i.e., bit lines). In some aspects, a digital value is stored as a memory resistance (high or low). The memory state of a memory cell can be read by supplying a voltage to the word line connected to the selected memory element. The resistance or memory state can be read as an output voltage of the bit line connected to the selected memory cell.

Cross-point resistor memory arrays are prone to read disturbance problems. As part of the read operation, electric current flows from a selected word line, through a selected memory cell, to a bit line. However, current also flows into unselected word lines that happen to cross over the selected bit line. The conduction of current into unselected word lines acts to decrease the output impedance and, hence, reduce the output voltage. To clearly distinguish memory states, the output voltage must be clearly distinguishable.

The undesired flow of current through a resistance memory cell can be addressed through the use of series-connected diodes, since reverse biased diodes are poor conductors. However, this same feature makes a one-diode/one resistor (1D1R) memory difficult to program. Programming voltages cannot be used that reverse bias the diode. Therefore, 1D1R cells are better for suited for unipolar programming. Further, diodes are preferable formed from single crystal silicon, for optimal performance. However, large crystal grains are difficult to form using thin-film deposition processes.

Many cross-point resistor memory array structures have been proposed in attempts to minimize cross-talk problems during read operations in a large area cross-point resistor memory array. 1R1D memory cell are well suited for a mono-polarity programming memory array. However, high performance diodes can only be fabricated on single crystal silicon. For multi-layer three-dimensional arrays, the upper layer of a diode is formed by re-crystallization of deposited silicon, and the resulting diode usually exhibits poor electrical properties. In addition, the diode must be formed from a silicon film that is fairly thick.

Rinerson et al., U.S. Pat. No. 6,753,561, have proposed a memory cell of a metal/insulator/metal (MIM) structure in series with a resistor memory. The MIM device is non-conductive at low biases. When the bias voltage is higher than a certain value, the conductivity drastically increases. This voltage is called either the "current rise-up voltage" or "varistor voltage". The high field generated in response to the MIM high current region is associated with impact ionization. MIM devices are well known to be unstable if subjected to high current density stress. This is due to deep trap states in the insulator and the local avalanche breakdown when a high electric field is applied to the insulator. As a result, the current voltage characteristics are reversible only at relatively low current conditions. Therefore, MIM non-ohmic devices are not suitable for cross-point memory cells, which require a large numbers of programming operations. In addition, Rinerson does not teach specific MIM materials, or how a MIM device is fabricated.

It would be advantageous if a back-to-back Schottky diode device could be easily fabricated at relatively low temperatures that was highly conductive when forward biased, poorly conductive when reversed biased at relatively low voltages, but highly conductive when reversed biased at higher voltages.

It would be advantageous if the above-mentioned diode could be fabricated with a resistance memory device, to build 1R1D crosspoint memory arrays that have low leakage current, but are capable of programming using bipolar voltages.

SUMMARY OF THE INVENTION

Described herein is a back-to-back diode device that permits current flow in both forward and reverse directions under higher voltage (forward and reverse) bias conditions, but blocks current in under lower voltage bias conditions. The current limiter can be added to a resistance memory cell, to permit high voltage bipolar programming, without the penalty of flowing current into unselected word lines during lower voltage read operations.

Many conventional cross-point resistor memory arrays suffer from read disturbance problems, as electric current flows from a selected word line, through a selected memory cell to a bit line, and then into unselected word lines which cross over the bit line. A cross-point array made with a current limiter in the memory cells minimizes the current flow into the unselected word lines, maximizing the output (read) voltage.

A metal/semiconductor/metal (MSM) back-to-back Schottky barrier device exhibits a symmetrical non-ohmic property with respect to both positive and negative bias voltages. This device can be used as memory cell current limiter in a resistor cross-point memory array. Since the conductivity of the semiconductor is high, and the capture cross-section of trap state is small, the device is stable operating at high fields. The current density of MSM devices can be several orders of magnitude higher than that of MIM devices.

In addition to 1R1D crosspoint memory applications, the MSM can be used in other applications and circuits that use a current limiting diode. In one aspect, details of an amorphous Si MSM diode (e.g., a TiN/A-Si/TiN structure) are presented, fabricated using DC-sputtering, B and As implantations, and post-annealing processes.

Accordingly, a method is provided for forming a MSM back-to-back Schottky diode from a silicon (Si) semiconductor. The method deposits a Si semiconductor layer between a bottom electrode and a top electrode, and forms a MSM diode having a threshold voltage, breakdown voltage, and on/off current ratio. The method is able to modify the threshold voltage, breakdown voltage, and on/off current ratio of the MSM diode in response to controlling the Si semiconductor layer thickness. Generally, both the threshold and breakdown voltage are increased in response to increasing the Si thickness. With respect to the on/off current ratio, there is an optimal thickness.

The method is able to form an amorphous Si (a-Si) and polycrystalline Si (polySi) semiconductor layer using either chemical vapor deposition (CVD) or DC sputtering. For example, DC sputtering can be used to form an a-Si film. The a-Si can then be annealed to form polySi. Increases in the DC sputtering power or substrate temperature, result in a decrease in threshold voltage, an increase in breakdown voltage, and a decrease in the on/off current ratio. Likewise, the threshold voltage and breakdown voltage increase in response to increasing the oxygen partial pressure. If the semiconductor layer is deposited to the optimal thickness, then the on/off current ratio is decreased when the Si thickness is made thinner, as both the on and off currents increase. Likewise, if the Si thickness is made greater than the optimal thickness, then the on/off current ratio also decreases, as both the on and off currents decrease.

Fabrication details are also presented for the deposition of semiconductor material using the CVD process. In addition, the Si semiconductor can be doped with a Group V donor material. Doping decreases the threshold voltage and increases the breakdown voltage. There is also an on/off current ratio optimal thickness to consider when doping is used.

Additional details of the above-described method of forming an MSM back-to-back Schottky diode, and an MSM diode device are provided below.

DETAILED DESCRIPTION

Figure 1:
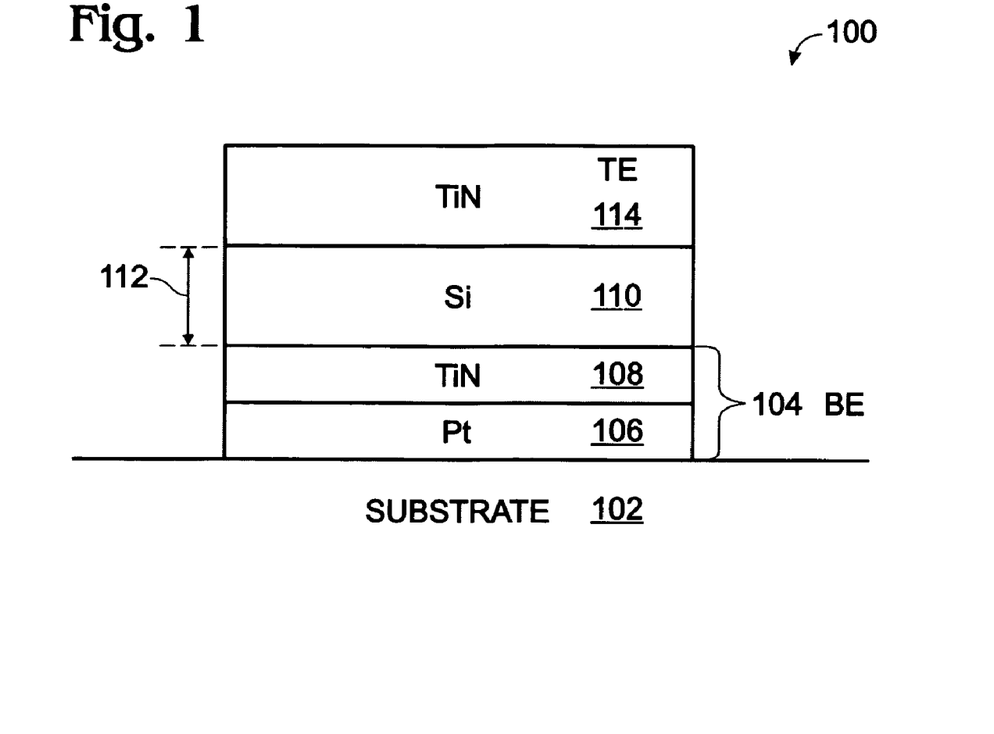
FIG. 1 is a partial cross-sectional view of a metal/semiconductor/metal (MSM) back-to-back Schottky diode fabricated from a silicon (Si) semiconductor.

FIG. 1 is a partial cross-sectional view of a metal/semiconductor/metal (MSM) back-to-back Schottky diode fabricated from a silicon (Si) semiconductor. The MSM diode 100 comprises a Si substrate 102, and a bottom electrode (BE) 104 with a Pt layer 106 overlying the substrate 102, and a TiN layer 108 overlying the Pt layer 106. An amorphous Si (a-Si) semiconductor layer 110 overlies the bottom electrode 104. The a-Si semiconductor layer 110 has a thickness 112 in the range of 10 to 80 nanometers (nm). A TiN top electrode (TE) 114 overlies the a-Si semiconductor layer 110.

The a-Si semiconductor range of thickness may be considered unconventional, and even unexpected. As described in more detail below, the optimal device performance is dependent upon a thickness that must be balanced against considerations of threshold voltage, breakdown voltage, and on/off current ratio.

As described in more detail below, generally the MSM diode 100 has a threshold voltage in the range of about 0.8 to 2 volts and a breakdown voltage in the range of about 2.5 to 6 volts. If the a-Si semiconductor layer 110 has a thickness 112 of about 30 nm, then the MSM diode has a threshold voltage of about 1.5 volts, a breakdown voltage of about 3.5 volts, and an on/off current ratio of about $1.5 \times 10^2$ amperes per square centimeters ($A/cm^2$) at 3 volts, to $6 \times 10^{-2}$ $A/cm^2$ at 1 volt, which is 3.5 orders of magnitude.

When the a-Si semiconductor layer 110 includes a Group V donor dopant material, the MSM diode 100 has a threshold voltage in the range of about 2 to 3.5 volts and a breakdown voltage in the range of about 6 to 12 volts. If the doped a-Si semiconductor layer 110 has a thickness 112 of about 30 nm, then the MSM diode 100 has a threshold voltage of about 2.5 volts and a breakdown voltage of about 6 volts.

Besides the materials specifically mentioned above, the top electrode 114 and bottom electrode 104 can be made from the following materials: Pt, Ir, Au, Ag, TiN, AlCu, Pd, W, Ti, Cr, Si, Al, Rh, Ta, Ru, TaN, YBCO, indium tin oxide (ITO), InO3, ZnO, RuO2, and $La_{1-x}Sr_xCoO_3$. However, other unnamed electrode materials are also known in the art that may be used. The substrate 102 is not limited to Si, and may be a material such as Ge, $SiO_2$, GeAs, glass, quartz, or plastic. Further, although an a-Si semiconductor material has been presented, in other aspects the semiconductor material is polySi.

Figure 2:
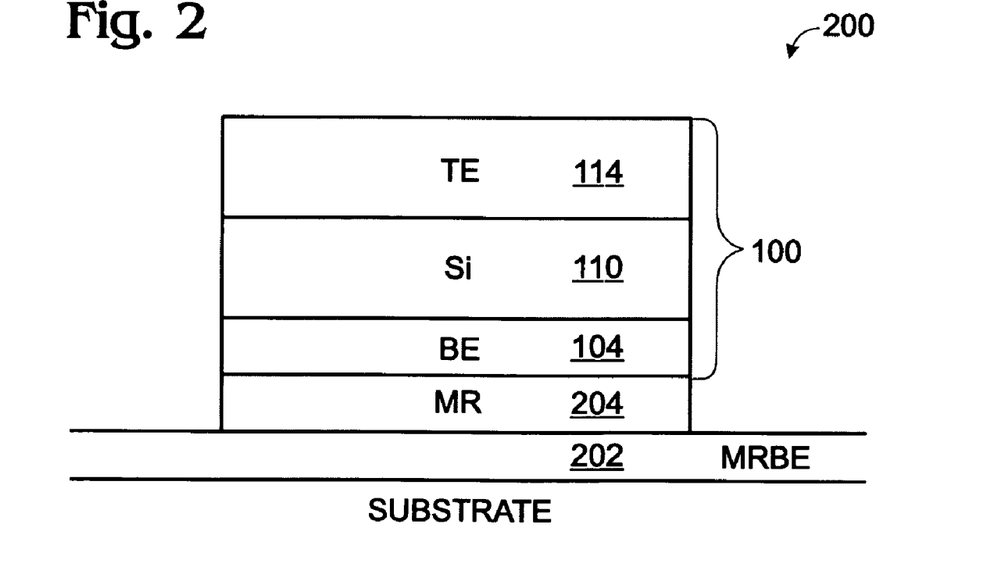
FIG. 2 is a partial cross-sectional view of a resistance memory device with a MSM back-to-back Schottky diode.

FIG. 2 is a partial cross-sectional view of a resistance memory device with a MSM back-to-back Schottky diode. The device 200 comprises a memory resistor bottom electrode (MRBE) 202 and a memory resistor (MR) material 204 overlying the memory resistor bottom electrode 202. A MSM diode 100 overlies the memory resistor material 204. The MSM diode is shown in FIG. 1 and described above, and will not be repeated here in the interest of brevity.

The memory resistor material 204 overlying the memory resistor bottom electrode 202 may be a material such as $Pr_{0.3}Ca_{0.7}MnO_3$ (PCMO), colossal magnetoresistive (CMR) film, transition metal oxides, Mott insulators, high-temperature super conductor (HTSC), or perovskite materials.

The MSM top electrode 114 may be a word line in an array of connected memory devices. In a memory array, a plurality of devices 200 would be attached to each bit line and word line, as is well understood in the art. Then, the MR bottom electrode 202 would be a bit line connected to other memory devices (not shown) in the array. In other aspects not shown, the MSM diode 100 is formed "under" the MR cell, as opposed to "over" the memory cell as shown. That is, the MSM bottom metal electrode 104 would be the bit line, with the memory resistor bottom electrode 202 formed overlying the MSM top electrode 114. Then, an MR top electrode over the MR material 204 (not shown) would be a word line. Materials such as Pt, Ir, Au, Ag, Ru, TiN, Ti, Al, ALCu, Pd, Rh, W, Cr, conductive oxides, Ag, Au, Pt, Ir, or TiN, may potentially be used as the MR top and bottom electrodes.

Functional Description

As described above, the present invention MSM current limiter can be used for crosspoint resistance random access memory (RRAM) arrays and other applications. To that end, amorphous Si MSM structures were studied, especially TiN/a-Si/TiN with a-Si thickness ranging from about 10 nm to 80 nm, with and without As implantation, using DC-sputtering methods. The current/voltage (IV) curves of the MSM devices with a-Si thin films exhibit non-linear characteristics. The threshold voltage and breakdown voltage increase, and the current decreases, as the a-Si film thickness increases. Interesting data is observed from MSM devices having an a-Si thickness in the range of about 30 and 50 nm.

Experimental Methods

The substrate is a P-type Si (100) wafer. After SC1, SC2 cleaning and HF 20:1 dip etching, 100 nm Pt and 150 nm TiN layers are deposited on the Si wafer to form the bottom electrode. The bottom and top electrodes can be any metals such as Pt, Ir, Al, AlCu, Au, Ag, Pd, Rh, W, Ti, Cr, and Si, to name a few materials. The bottom and top electrodes can also be conductive oxides such YBCO, ITO, InO3, ZnO, RuO$_2$, and La$_{1-x}$Sr$_x$CoO$_3$. Interesting data is obtained from TiN/a-Si/TiN structures.

Amorphous Si thin films with various thicknesses from 10 nm to 80 nm can be deposited on TiN using DC-sputtering and CVD methods. The DC-sputtering and CVD process conditions are listed in Table 1 and 2. As an experiment, half of the wafers with various thicknesses are implanted with As, at 30 keV, with dose of 1E12, and annealed at 500° C. for 10 minutes. MSM diodes with polySi films thickness of 1200 nm are also formed, with double ion implantations of B at 200 keV and 1E13, and an As-implantation of 30 keV and 2E15, with post-annealing at temperatures from about 700-900° C. for 30-90 minutes. Finally, top electrodes of TiN, with thickness of 150 nm are deposited and patterned on the a-Si to make MSM device structures. The device structure is Si/Pt (100 nm)/TiN(150 nm)/a-Si/TiN(150 nm).

The phases of the a-Si films can be identified using x-ray diffraction. A Scanning Electron Microscope can be used to measure the thickness and surface morphologies of the films. The properties of the MSM devices with various a-Si thickness can be measured using a HP 4156A precision semiconductor parameter analyzer.

TABLE 1

The DC sputtering process conditions for a-Si thin films

| Target | Power (W) | Dep. Temp. | Dep. Pres. | Atmosphere | Dep. Time |
|---|---|---|---|---|---|
| Si | 100-300 | 20-200° C. | 7-9 mtorr | Ar | 7-150 m |

TABLE 2

The process conditions for CVD polysilicon deposition

| Silane flow | Deposition temp. | Deposition pressure | Deposition time |
|---|---|---|---|
| 40–200 sccm | 500–600° C. | 150–250 mtorr | 10 min.–6 hours |

Experimental Results

Figure 3A:
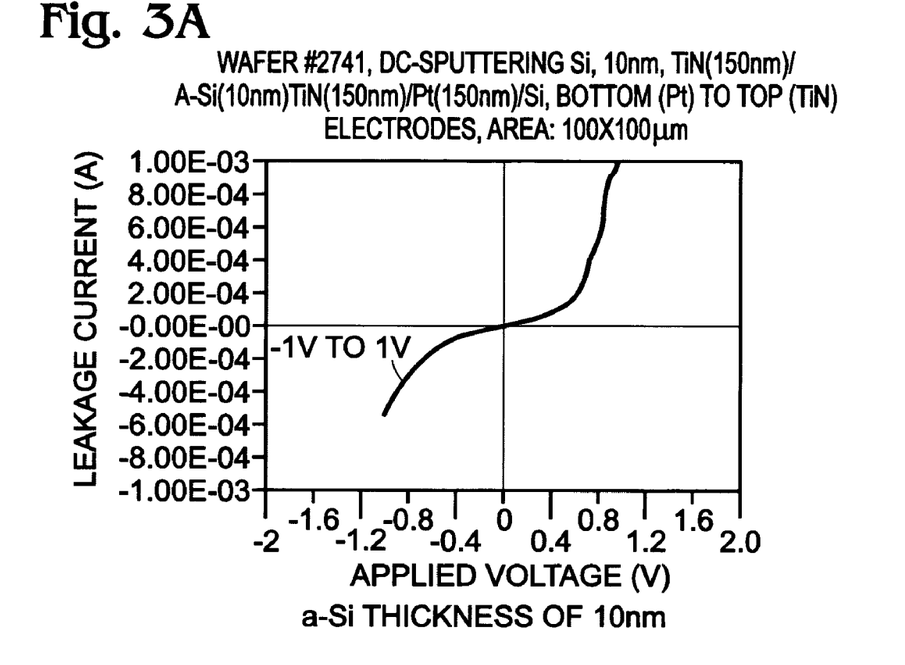
FIG. 3A through 3F are IV curves of MSM devices with various a-Si thicknesses.

FIG. 3A through 3F are IV curves of MSM devices with various a-Si thicknesses. The device size is about 100um×100um. The IV measurements are from the top electrode of TiN, to bottom electrode Pt layer. The IV curves of the devices with a-Si of 10 nm exhibit non-linear characteristics when the applied voltage is equal to, or smaller than 1 V. The threshold voltage is around 0.2 V and the breakdown voltage is about 1 V, as shown in FIG. 3A. After breakdown, the MSM device loses its non-linear characteristics. With increasing a-Si film thickness, the threshold voltage and breakdown voltage increase, and the current decreases at the same applied voltage. On the other hand, by increasing the a-Si film thickness, the a-Si MSM devices show much better non-linear characteristics for current limiter applications.

Figure 3B:
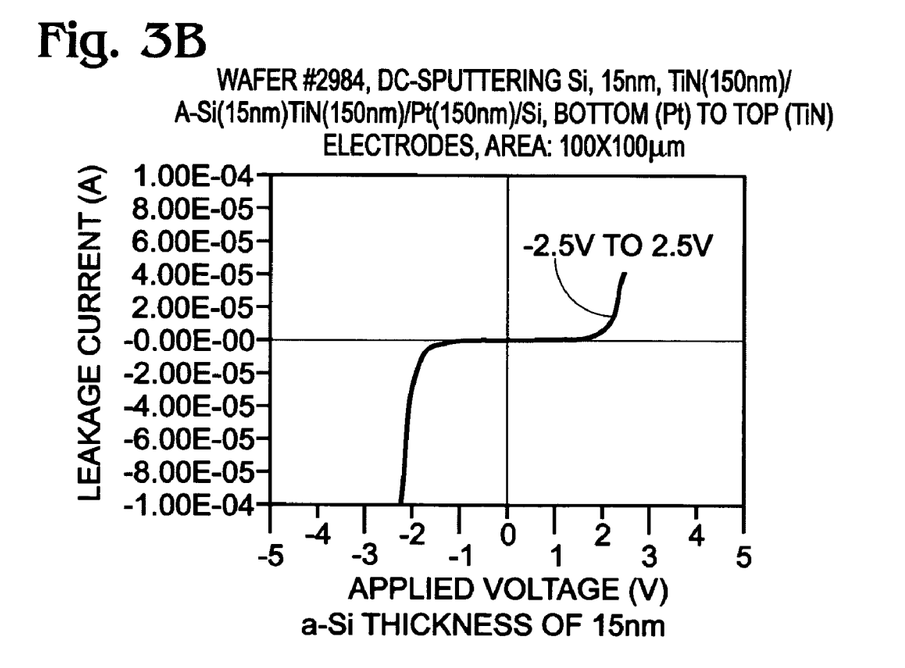

In FIG. 3B the a-Si film thickness is 15 nm, the threshold voltage is about 0.8 V, and the breakdown voltage is larger than 2.5 V.

Figure 3C:
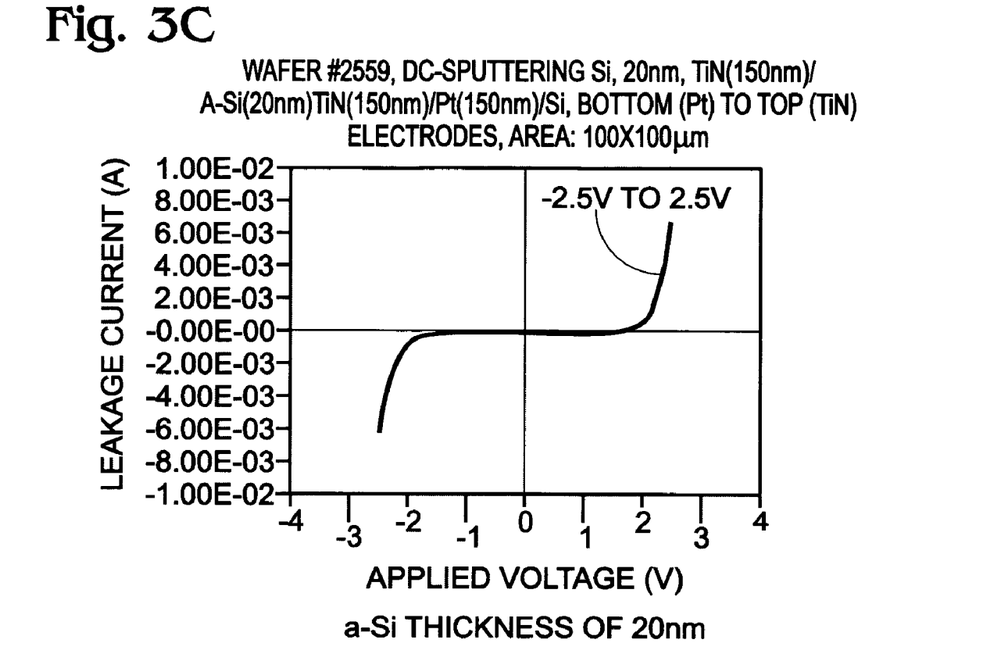

In FIG. 3C the a-Si film thickness is 20 nm, the threshold voltage is about 1.3 V, and the breakdown voltage is larger than 2.5 V. The a-Si MSM devices show very nice non-linear characteristics, suitable for current limiter applications.

Figure 3D:
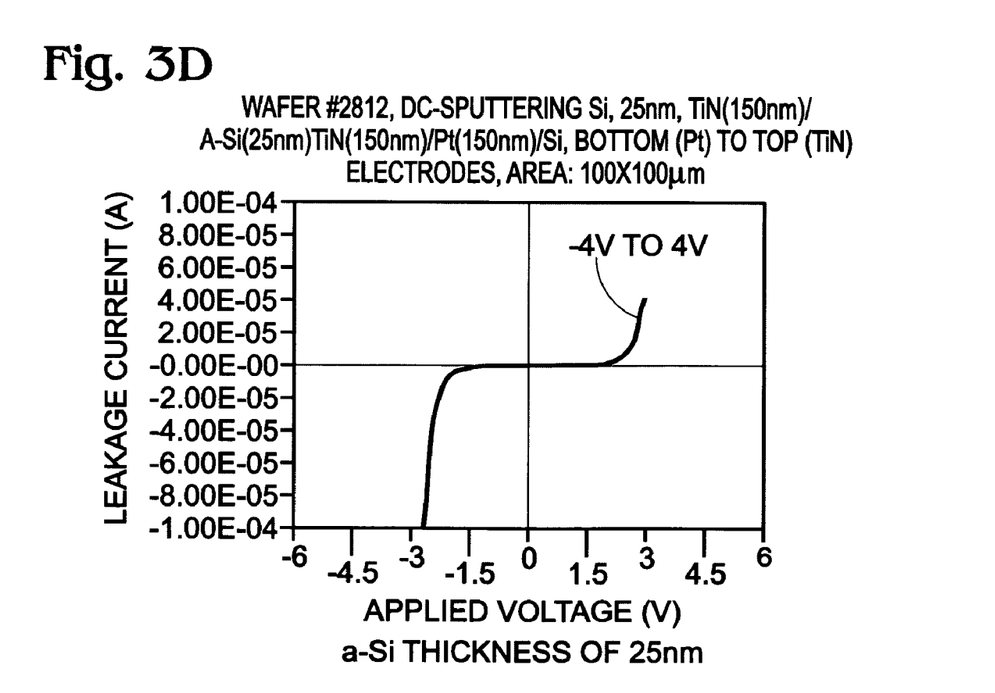

In FIG. 3D the a-Si film thickness is 25 nm, the threshold voltage is about 1.7 V, and the breakdown voltage is larger than 3.5 V.

Figure 3E:
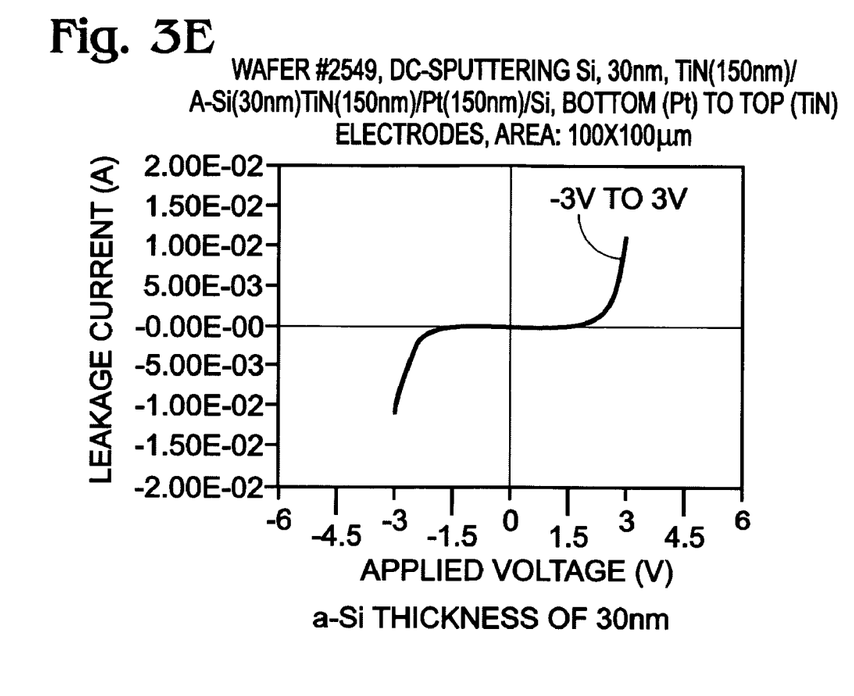

In FIG. 3E the a-Si film thickness is 30 nm, the threshold voltage is around 1.5 V, and the breakdown voltage is larger than 3.5 V.

Figure 3F:
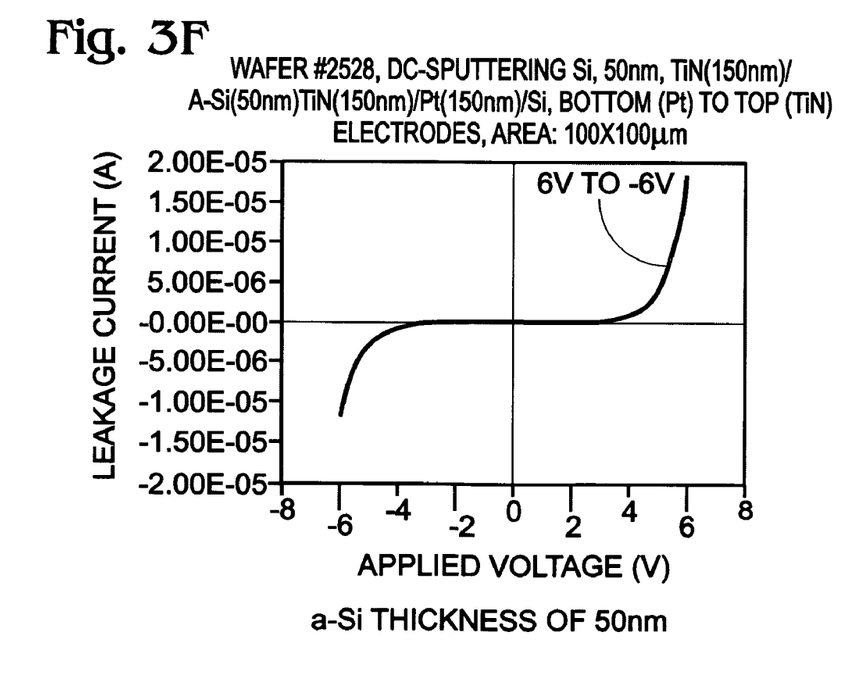

In FIG. 3F the a-Si film thickness is 50 nm, the threshold voltage is around 2 V, and the breakdown voltage is larger than 6 V.

Figure 4:
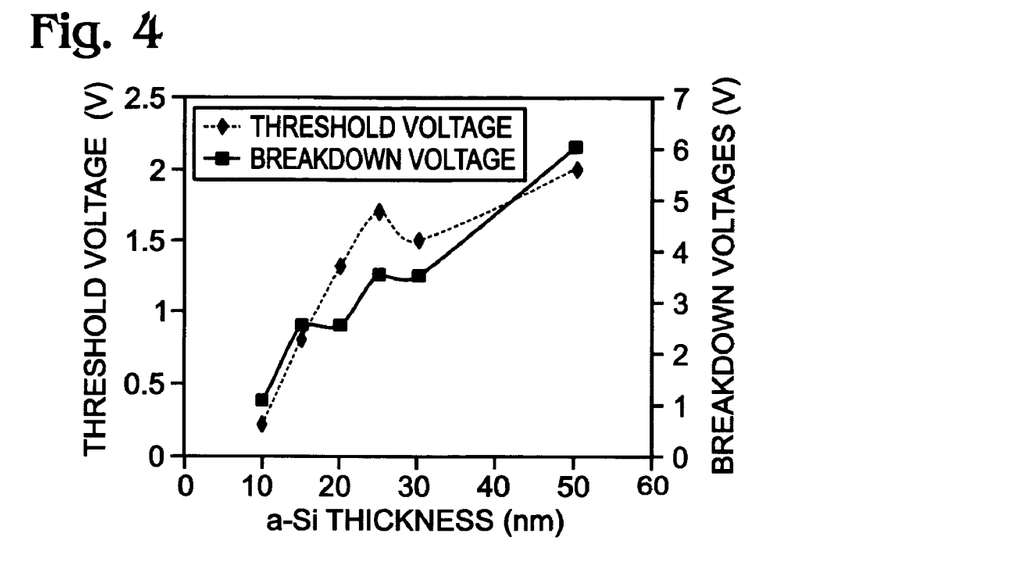
FIG. 4 is a graph depicting the relationship between threshold voltages, breakdown voltage, and a-Si thicknesses.

FIG. 4 is a graph depicting the relationship between threshold voltages, breakdown voltage, and a-Si thicknesses. The MSM device of FIG. 3F, with an a-Si thickness of 30 nm, shows interesting current limiting characteristics. The "on" current density at an applied voltage of 3 V is about $1.5 \times 10^2$ A/cm$^2$, and the "off" current density at an applied voltage of 1 V is about $6 \times 10^{-2}$ A/cm$^2$. The ratio of "on" current density to "off" current density is of the order of 3.5.

Figure 5A:
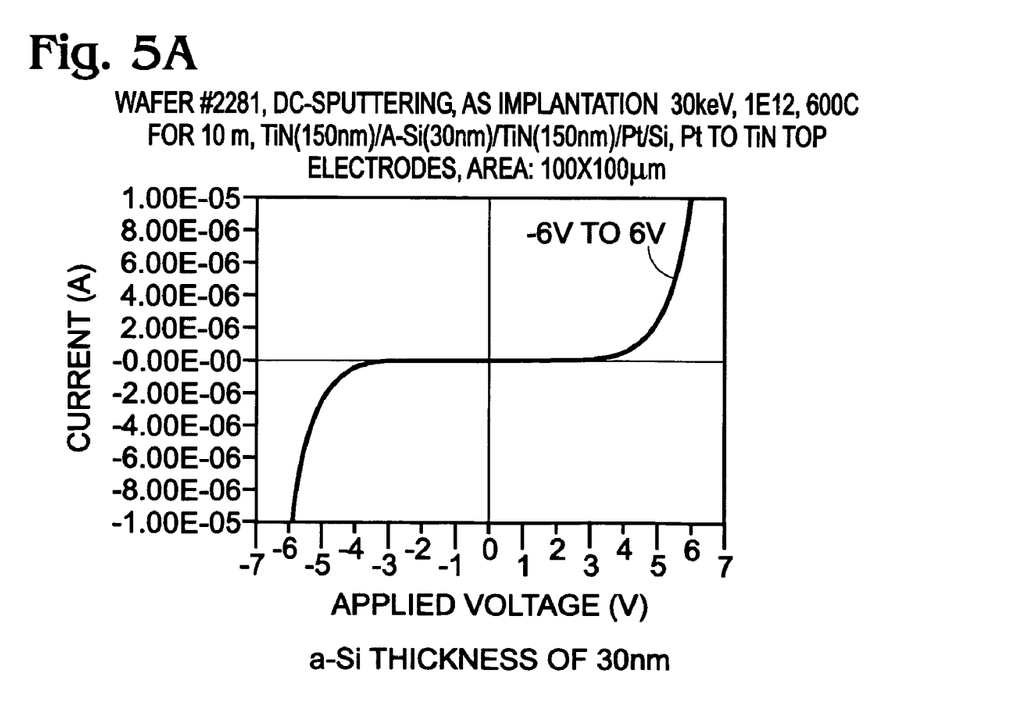
FIGS. 5A through 5D are graphs depicting the IV behavior of MSM devices with As-implanted Si thin films.

FIGS. 5A through 5D are graphs depicting the IV behavior of MSM devices with As-implanted Si thin-films. Arsenic implanted Si thin-films, with thicknesses from 30 nm to 80 nm, are investigated to further explore the non-linear characteristics of a-Si MSM devices for current limiter applications. In FIG. 5A the a-Si film thickness is 30 nm, the threshold voltage is about 2.5 V, and the breakdown voltage is larger than 6 V.

Figure 5B:
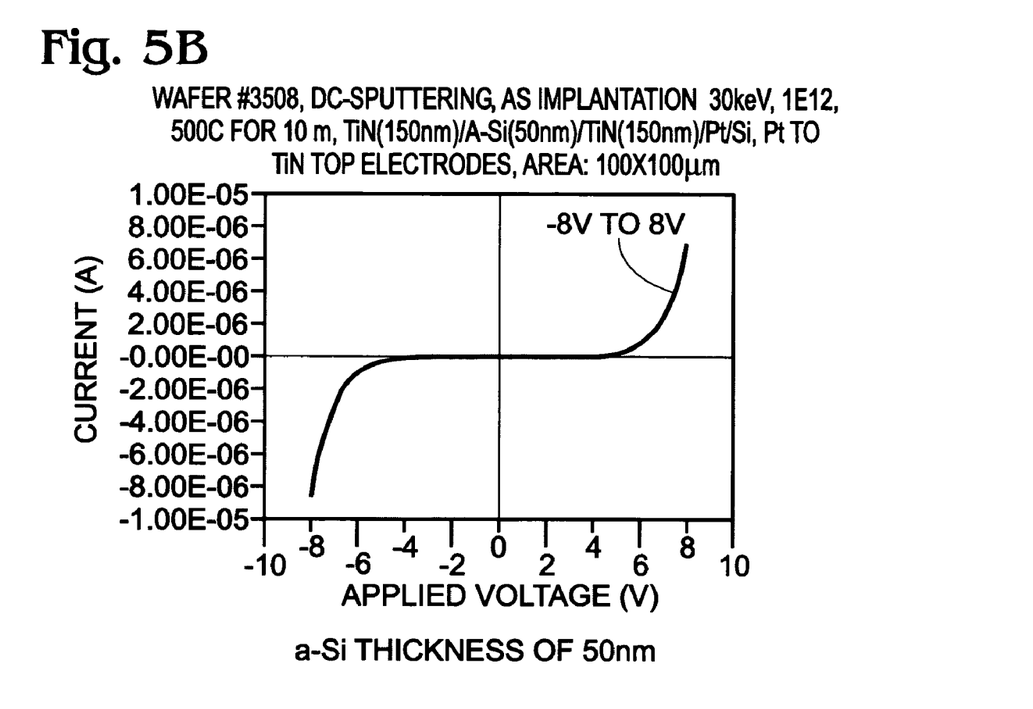

In FIG. 5B the a-Si film thickness is 50 nm, the threshold voltage is around 3 V, and the breakdown voltage is larger than 8 V.

Figure 5C:
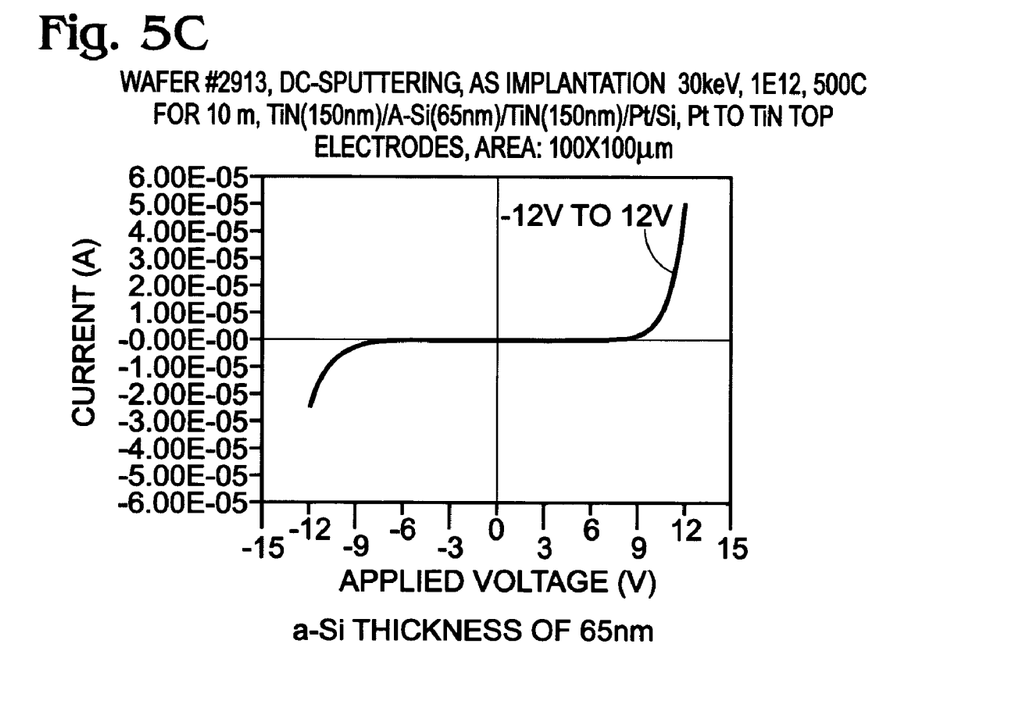

In FIG. 5C the a-Si film thickness is 65 nm, the threshold voltage is around 4 V, and the breakdown voltage is larger than 12 V.

Figure 5D:
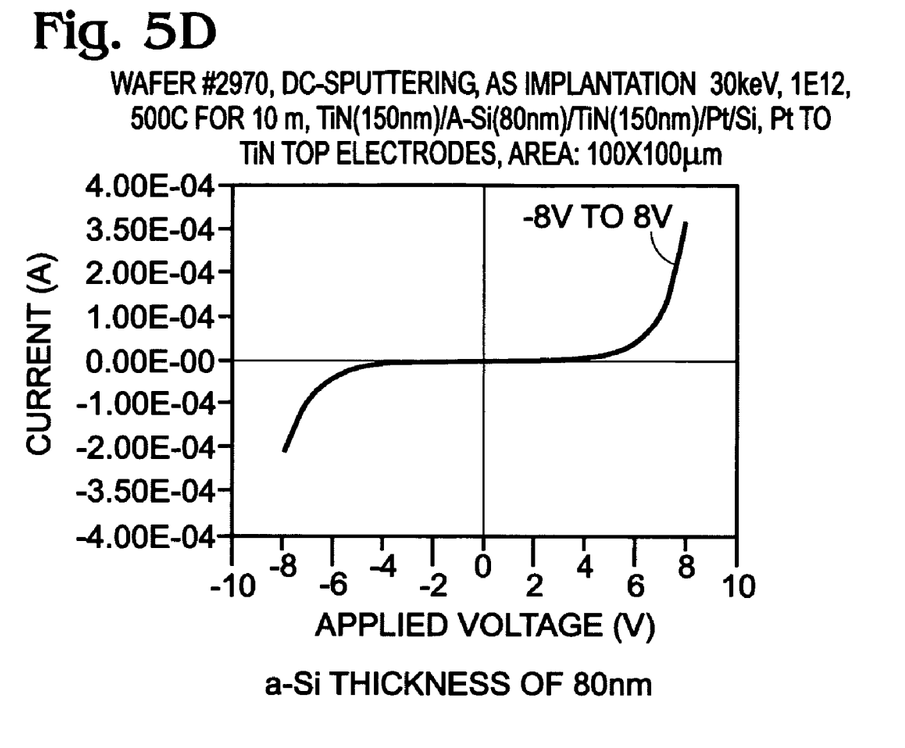

In FIG. 5D the a-Si film thickness is 80 nm, the threshold voltage is round 3.5 V, and the breakdown voltage is larger than 10 V.

Figure 6:
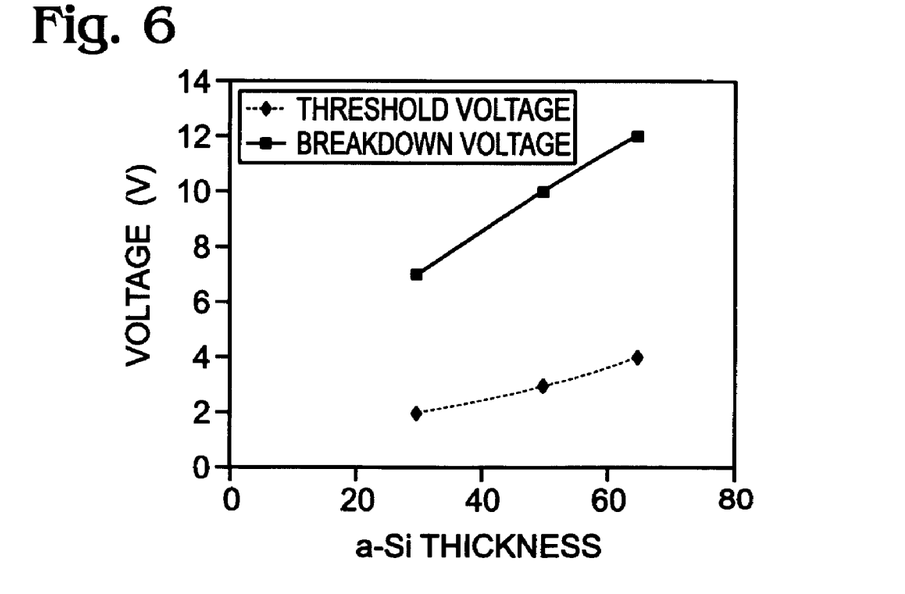
FIG. 6 is a graph depicting the relationship between threshold voltage, breakdown voltage, and a-Si thickness when the a-Si is implanted with As dopant.

FIG. 6 is a graph depicting the relationship between threshold voltage, breakdown voltage, and a-Si thickness when the a-Si is implanted with As dopant. Compared to MSM devices without implantation, the MSM device with As-implanted Si thin films show very good nonlinear characteristics, higher threshold and breakdown voltages, but lower currents. The reason may due to the formation of surface oxide on amorphous Si during the implantation and post-annealing.

Figure 7A:
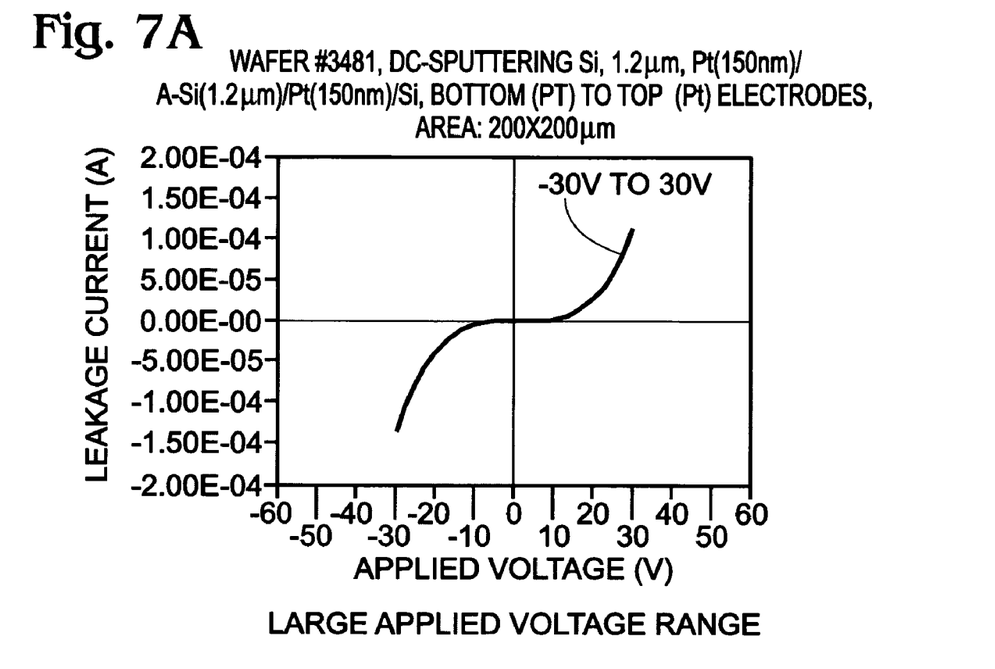
FIGS. 7A and 7B are graphs depicting IV curves of MSM devices with a-Si thicknesses of 1200 nm and device sizes of 200 um ×200 um.
Figure 7B:
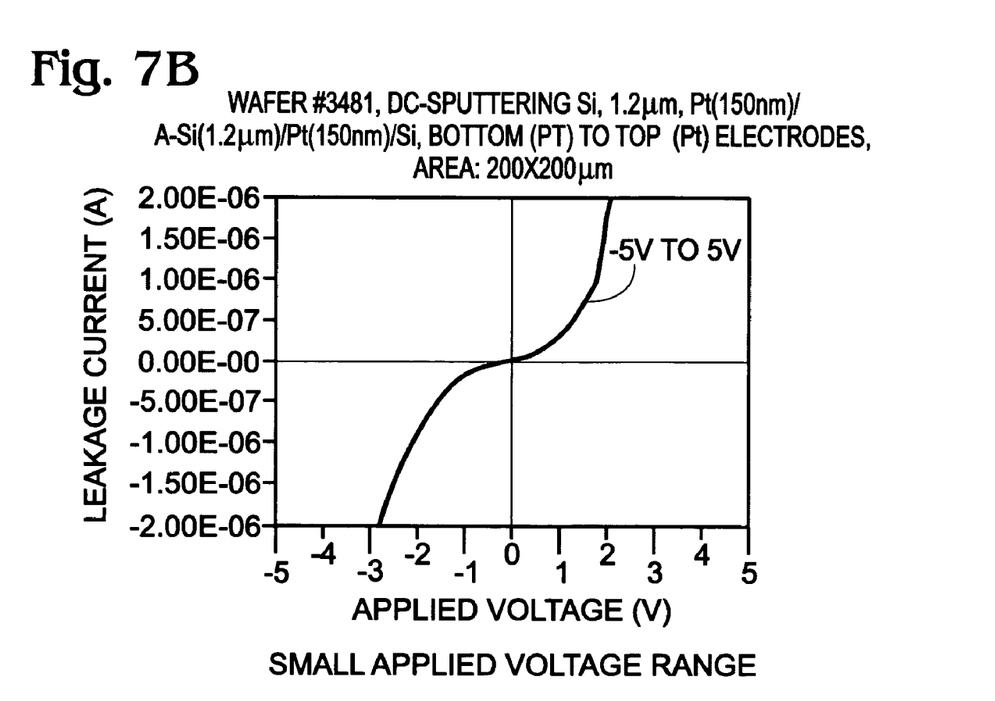

FIGS. 7A and 7B are graphs depicting IV curves of MSM devices with a-Si thicknesses of 1200 nm and device sizes of 200 um×200 um. The IV measurements are from top electrode of Pt, to bottom electrode of Pt. From the experiment results, further increasing of a-Si thickness up to 1200 nm, result in threshold voltage increases and breakdown voltage increases over 50 V. The currents decrease with increasing a-Si thickness, which means that the resistances of the MSM devices increase. The threshold voltage is very small when low applied voltages are used. But the threshold voltage can be increased after higher voltage training, which switches the devices at higher voltages, before using a lower operation voltage to measure the IV curves. The threshold voltages increase with increases in applied voltages, which is non-ideal for current limiter applications.

Figure 8A:
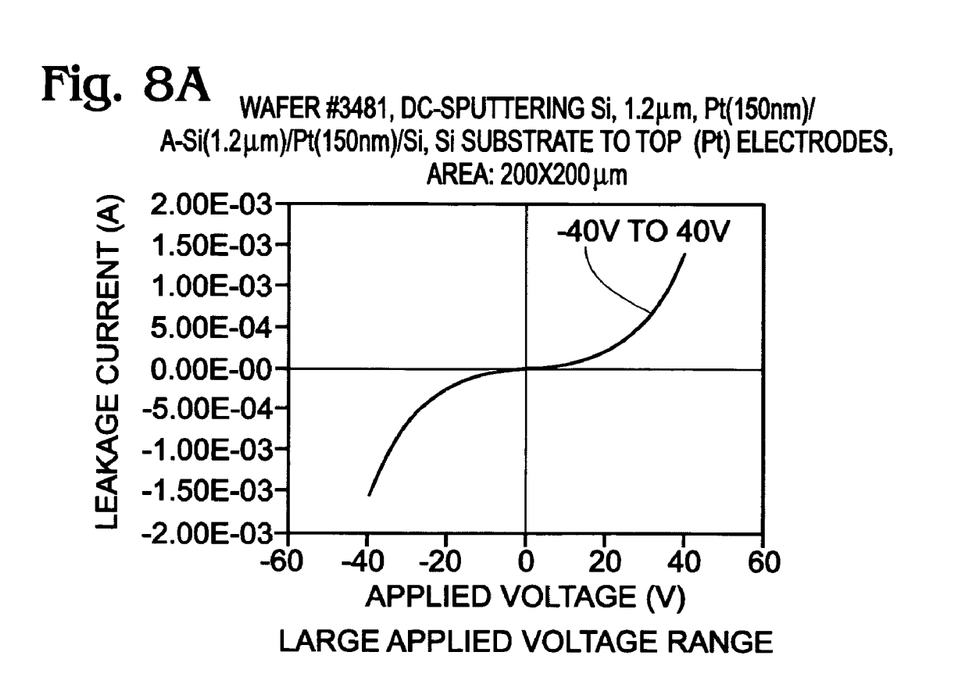
FIGS. 8A and 8B are graphs depicting the IV curves of MSM devices with a-Si thicknesses of 1200 nm and device sizes of 200 um×200 um.
Figure 8B:
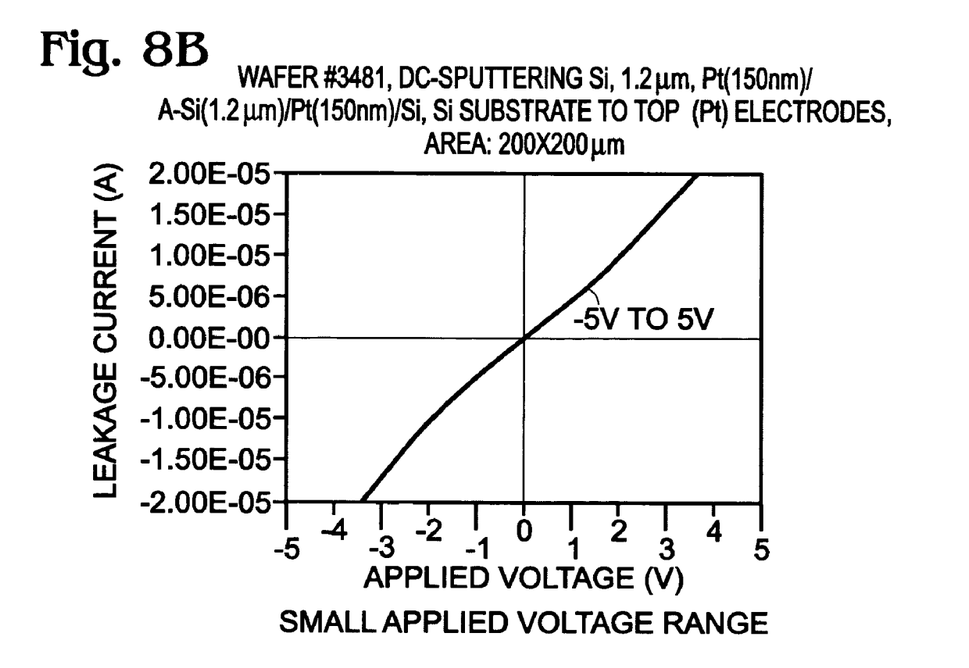

FIGS. 8A and 8B are graphs depicting the IV curves of MSM devices with a-Si thicknesses of 1200 nm and device sizes of 200 um×200 um. The devices are measured from the top electrode of Pt, to the Si substrate. For the high applied voltages, the IV curves exhibit non-linear characteristics, as shown in FIG. 8A. But the IV curves tend to be linear when the low voltages are applied, as shown in FIG. 8B. The threshold voltages also increase with increases in applied voltages. The experimental results show that the MSM devices with thick a-Si films are non-ideal for current limiter applications.

In summary, the IV curves of the MSM devices with a-Si thin films exhibit non-linear characteristics. The threshold voltage and breakdown voltage increase, and the current decreases, with increases in the a-Si film thickness. Compared with MSM devices without implantation, MSM devices with As implanted in the Si thin-films show very good nonlinear characteristics, higher threshold and breakdown voltages, but lower currents. The reason may due to the formation of surface oxide on amorphous Si during the implantation and post-annealing, which may be cured with an HF surface cleaning. Good current limiter data is obtained from MSM devices with an a-Si thickness of 30 nm, as shown in FIG. 3F. The "on" current density at an applied voltage of 3V is about $1.5 \times 10^2$ A/cm$^2$, and the "off" current density at applied an voltage of 1V is about $6 \times 10^{-2}$ A/cm$^2$, which is a ratio of about 3.5.

A crosspoint resistor memory array requires a current limiting device, such as diode, in series with the bit memory resistor, to minimize the programming interference, programming disturbance, and read disturbances. A crosspoint memory array with a diode in series with the memory resistance bit cells can only be programmed using mono-polarity voltage pulses. Since a high quality (single-crystal) diode cannot be fabricated onto metal multi-layers, the integration of a resistor cross-point memory array with a diode/resistor cell is not feasible. A MIM current limiter cannot be used in place of diode, as a metal-insulator-metal device is not reliable, even in a very small current density operation. The reliability problems are due to the deep trap states in the insulator and the local catastrophic breakdown in the insulator. However, if the insulator is replaced with a semiconductor material, a back-to-back Schottky structure can be formed.

The MSM device functions as a back-to-back Schottky diode. The current density is dependent upon the barrier height of the metal, with respect to the semiconductor. The series resistance of the MSM device may be decreased, by reducing the thickness and the resistivity of the semiconductor material. If the semiconductor is too thin, the leakage current of the device increases and the low bias voltage current may be too large for some practical memory cell applications. Since the purpose of MSM device is to limit the current flow through the unselected cells in an array, the IV properties of the MSM device do not have to be symmetric around the zero bias voltage. Therefore, the MSM electrodes need not be the same material.

Figure 9:
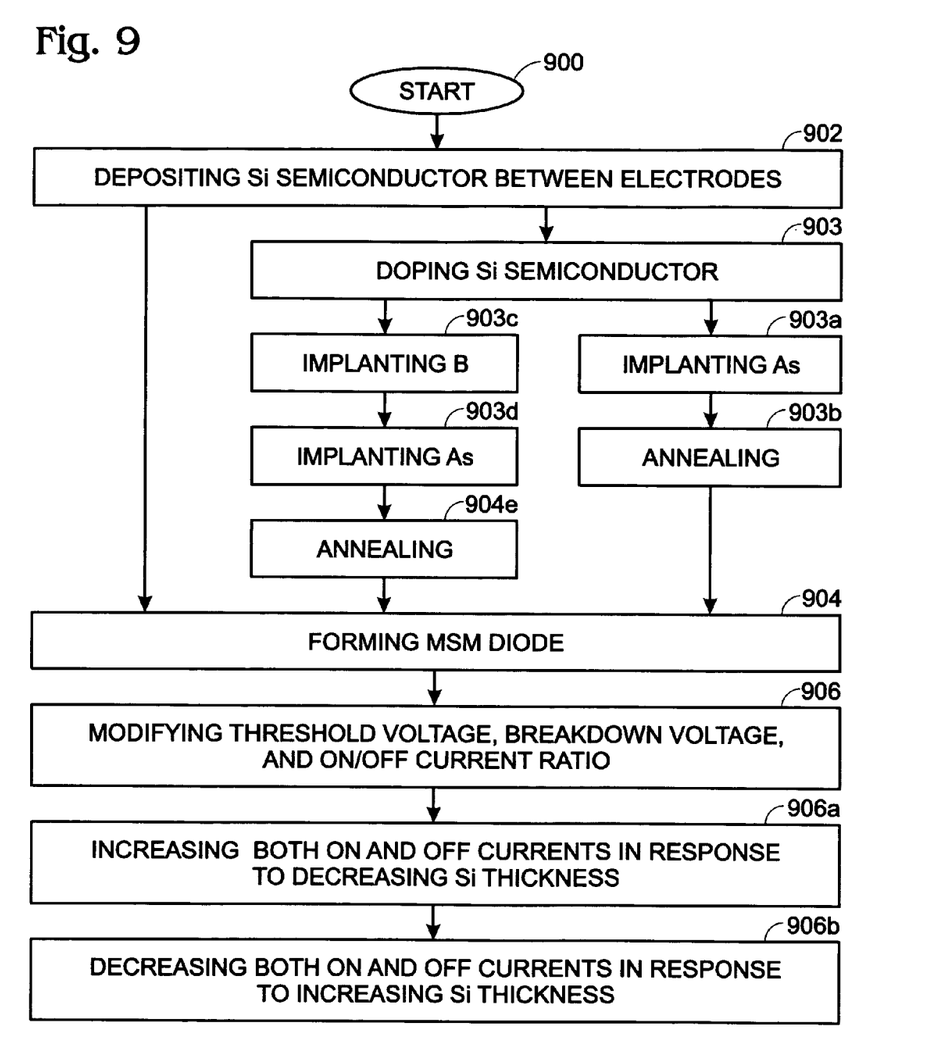
FIG. 9 is a flowchart illustrating a method for forming a MSM back-to-back Schottky diode from a Si semiconductor.

FIG. 9 is a flowchart illustrating a method for forming a MSM back-to-back Schottky diode from a Si semiconductor. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 900.

Step 902 deposits a Si semiconductor layer between a bottom electrode and a top electrode. Depositing the Si semiconductor layer in Step 902 includes forming a semiconductor layer selected from a-Si or polySi materials, using a CVD or DC sputtering process. Step 904 forms a MSM diode having a threshold voltage, breakdown voltage, and on/off current ratio. Step 906 modifies the threshold voltage, breakdown voltage, and on/off current ratio of the MSM diode in response to controlling the Si semiconductor layer thickness.

Generally, increasing the Si thickness in Step 902 leads to an increase in the threshold voltage and an increase the breakdown voltage (Step 906). With respect to the on/off ratio, however, there is an optimal thickness. The optimal thickness is associated with a large on/off current ratio. If the Si semiconductor layer is deposited to this so-called optimal thickness in Step 902, then modifying the on/off current ratio of the MSM diode in Step 906 includes substeps. Step 906a increases both the on and off currents in response to decreasing the Si thickness below optimal thickness. Step 906b decreases both the on and off currents in response to increasing the Si thickness above the optimal thickness.

In one aspect, Step 902 forms an a-Si semiconductor with the DC sputtering process as follows:

using a Si target;
sputtering with a power in the range of about 100 to 300 watts (W);
heating a substrate to a temperature of about 20° to 200° C.;
creating a deposition pressure in the range of about 7.0 to 9 mtorr;
using an atmosphere of Ar;
depositing for a duration in the range of about 7 to 150 minutes; and,
forming a-Si.

Step 902 forms a polySi semiconductor with the DC sputtering process, following the formation of the a-Si, by annealing at a temperature greater than 550° C., and forming polySi as a result.

In one aspect, increasing the DC sputtering power or substrate temperature in Step 902 results in (Step 906) decreasing the threshold voltage, increasing the breakdown voltage, and decreasing the on/off current ratio.

If Step 902 forms the a-Si semiconductor with a DC sputtering process that uses an oxygen partial pressure in the range of 0 to 5%, then Step 906 increases the threshold voltage and breakdown voltage in response to increasing the oxygen partial pressure. In considering the thickness of the Si semiconductor deposited in Step 902, Step 906 modifies the on/off current ratio of the MSM diode in response to increasing the oxygen partial pressure as follows. The on/off current ratio decreases when the Si thickness is less than the optimal (defined with respect to the on/off ratio) thickness. Likewise, the on/off current ratio decreases when the Si thickness is greater than the optimal thickness.

Alternately, Step 902 forms the Si semiconductor layer using a CVD process as follows:

flowing silane at a rate in the range of about 40 to 200 standard cubic centimeters (sccm);

heating the substrate to a temperature in the range of about 500 to 600° C.;

creating a deposition pressure in the range of about 150 to 250 milliTorr (mtorr); and, depositing for a duration in the range of about 10 minutes to 6 hours.

In another aspect of the method, Step 903 dopes the Si semiconductor layer with a Group V donor material. Then, modifying the threshold voltage, breakdown voltage, and on/off current ratio of the MSM diode in Step 906 includes decreasing the threshold voltage and increasing the breakdown voltage in response to increasing the doping the Si semiconductor layer.

In considering the thickness of the Si semiconductor deposited in Step 902, the on/off current ratio of the MSM diode is modified (Step 906) in response to doping the Si semiconductor layer as follows. The on/off current ratio decreases when the Si thickness is less than the optimal (as defined with respect to the on/off ratio) thickness. Likewise, the on/off current ratio decreases when the Si thickness is greater than the optimal thickness.

In one aspect, doping the Si semiconductor layer in Step 903 includes substeps. Step 903*a* implants As with an energy of about 30 keV and a dose of about $1\times10^{12}$. Step 903*b* anneals at a temperature of about 500° C. for about 10 minutes. In another aspect, Step 902 forms a polySi semiconductor layer having a thickness in the range of about 600 to 1200 nm. Then, doping the Si semiconductor layer in Step 903 includes alternate substeps. Step 903*c* implants B with an energy of about 200 keV and a dose of about $1\times10^{13}$. Step 903*d* implants As with an energy of about 30 keV and a dose of about $2\times10^{15}$. Step 903*e* anneals at a temperature in the range of about 700° to 900° C. for about 30 to 90 minutes.

Figure 10:
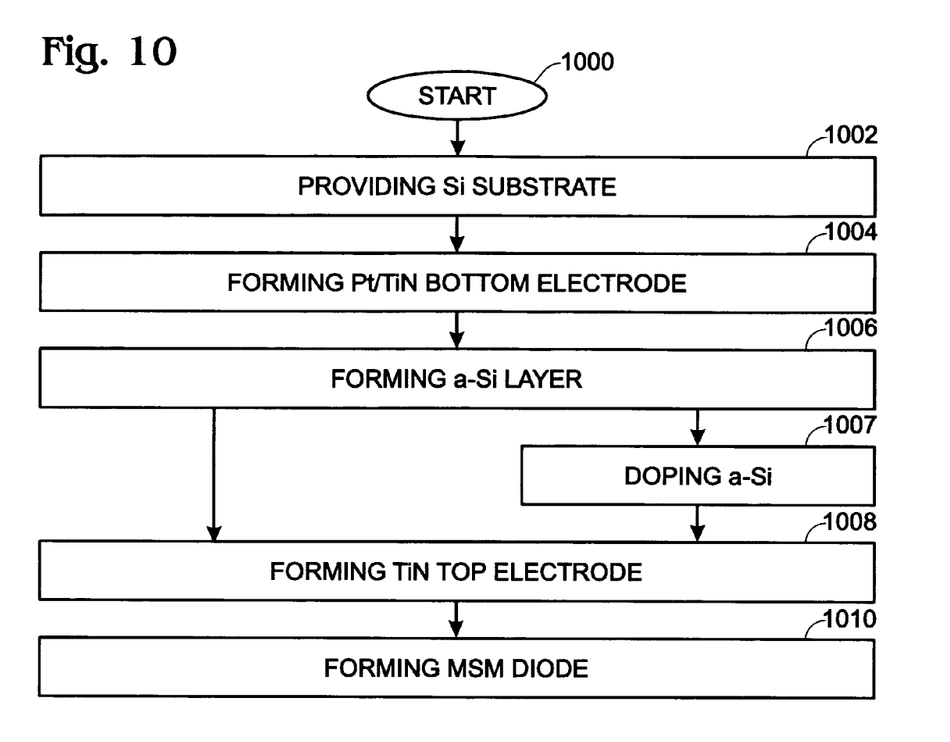
FIG. 10 is a flowchart illustrating another method for forming a MSM back-to-back Schottky diode from a Si semiconductor.

FIG. 10 is a flowchart illustrating another method for forming a MSM back-to-back Schottky diode from a Si semiconductor. The method starts at Step 1000. Step 1002 provides a Si substrate. Step 1004 forms a bottom electrode with a Pt layer overlying the substrate, and a TiN layer overlying the Pt layer. Step 1006 forms an a-Si semiconductor layer overlying the bottom electrode, having a thickness in the range of 10 to 80 nm. Step 1008 forms a TiN top electrode overlying the a-Si semiconductor layer. Step 1010 forms a MSM diode having a threshold voltage in the range of about 0.8 to 2 volts, and a breakdown voltage in the range of about 2.5 to 6 volts.

In one aspect, forming the a-Si semiconductor layer in Step 1006 includes forming an a-Si layer with a thickness of about 30 nm. Then, Step 1010 forms an MSM diode with a threshold voltage of about 1.5 volts and a breakdown voltage of about 3.5 volts. Step 1010 also forms an MSM diode with an on/off current ratio of about $1.5\times10^2$ amperes per square centimeters ($A/cm^2$) at 3 volts, to $6\times10^{-2}$ $A/cm^2$ at 1 volt, which is 3.5 orders of magnitude.

In another aspect, Step 1007 dopes the a-Si semiconductor layer with a Group V donor material. Then, Step 1010 forms an MSM diode with a threshold voltage in the range of about 2 to 3.5 volts and a breakdown voltage in the range of about 6 to 12 volts. If the a-Si semiconductor layer is formed to a thickness of about 30 nm (Step 1006), then Step 1010 forms an MSM diode with a threshold voltage of about 2.5 volts and a breakdown voltage of about 6 volts.

A MSM back-to-back Schottky diode made with a Si semiconductor, and corresponding fabrication processes have been provided. Examples of process details have been presented to illustrate the invention. Likewise, a resistance memory device has been presented as an example of an application. However, the invention is not limited to merely these examples. Other variations and embodiments of the invention will occur to those skilled in the art.

We claim:

1. A method for forming a metal/semiconductor/metal (MSM) back-to-back Schottky diode from a silicon (Si) semiconductor, the method comprising:

depositing an amorphous Si (a-Si) semiconductor layer between a bottom electrode and a top electrode with a DC sputtering process as follows:

using a Si target;

sputtering with a power in the range of about 100 to 300 watts (W);

heating a substrate to a temperature of about 20° to 200° C.;

creating a deposition pressure in the range of about 7.0 to 9 mtorr;

using an atmosphere of Ar;

depositing for a duration in the range of about 7 to 150 minutes; and, forming a-Si;

forming a MSM diode having a threshold voltage, a breakdown voltage, and an on/off current ratio; and, modifying the threshold voltage, the breakdown voltage, and the on/off current ratio of the MSM diode in response to controlling a thickness of the Si semiconductor layer.

2. The method of claim 1 further comprising:

following the formation of the a-Si, annealing at a temperature greater than 550° C.; and, forming polySi.

3. The method of claim 1 wherein modifying the threshold voltage, the breakdown voltage, and the on/off current ratio of the MSM diode includes decreasing the threshold voltage, increasing the breakdown voltage, and decreasing the on/off current ratio in response to increasing the DC sputtering power.

4. The method of claim 1 wherein modifying the threshold voltage, the breakdown voltage, and the on/off current ratio of the MSM diode includes decreasing the threshold voltage, increasing the breakdown voltage, and decreasing the on/off current ratio in response to increasing the substrate temperature.

5. The method of claim 1 wherein forming the a-Si semiconductor with the DC sputtering process includes using an oxygen partial pressure in the range of 0 to 5%; and, wherein modifying the threshold voltage, the breakdown voltage, and the on/off current ratio of the MSM diode includes increasing the threshold voltage and increasing the breakdown voltage in response to increasing the oxygen partial pressure.

6. The method of claim 5 wherein depositing the a-Si semiconductor layer includes forming an a-Si semiconductor layer having a first thickness; and, wherein modifying the on/off current ratio of the MSM diode in response to increasing the oxygen partial pressure includes:

decreasing the on/off current ratio when the Si thickness is less than the first thickness; and, decreasing the on/off current ratio when the Si thickness is greater than the first thickness.

7. The method of claim 1 wherein modifying the threshold voltage, the breakdown voltage, and the on/off current ratio of the MSM diode includes increasing the threshold voltage and increasing the breakdown voltage in response to increasing the Si thickness.

8. The method of claim 7 wherein depositing the a-Si semiconductor layer includes forming an a-Si semiconductor layer having a first thickness; and,
wherein modifying the on/off current ratio of the MSM diode includes:
increasing both the on and off currents in response to decreasing the Si thickness below the first thickness; and,
decreasing both the on and off currents in response to increasing the Si thickness above the first thickness.

9. The method of claim 1 further comprising:
doping the a-Si semiconductor layer with a Group V donor material; and,
wherein modifying the threshold voltage, the breakdown voltage, and the on/off current ratio of the MSM diode includes decreasing the threshold voltage and increasing the breakdown voltage in response to increasing the doping the Si semiconductor layer.

10. The method of claim 9 wherein depositing the a-Si semiconductor layer includes forming an a-Si semiconductor layer having a first thickness; and,
wherein modifying the on/off current ratio of the MSM diode in response to doping the Si semiconductor layer includes:
decreasing the on/off current ratio when the Si thickness is less than the first thickness; and,
decreasing the on/off current ratio when the Si thickness is greater than the first thickness.

11. The method of claim 9 wherein doping the a-Si semiconductor layer includes:
implanting As with an energy of about 30 keV and a dose of about $1 \times 10^{12}$; and,
annealing at a temperature of about 500° C. for about 10 minutes.

12. The method of claim 2 wherein forming polySi includes forming polySi having a thickness in the range of about 600 to 1200 nanometers (nm);
the method further comprising:
doping the polySi as follows:
implanting B with an energy of about 200 keV and a dose of about $1 \times 10^{13}$;
implanting As with an energy of about 30 keV and a dose of about $2 \times 10^{15}$; and,
annealing at a temperature in the range of about 700° to 900° C. for about 30 to 90 minutes; and
wherein modifying the threshold voltage, the breakdown voltage, and the on/off current ratio of the MSM diode includes decreasing the threshold voltage and increasing the breakdown voltage in response to increasing the doping the polySi semiconductor layer.

13. A method for forming a metal/semiconductor/metal (MSM) back-to-back Schottky diode from a silicon (Si) semiconductor, the method comprising:
depositing a Si semiconductor layer having first thickness between a bottom electrode and a top electrode;
forming a MSM diode having a threshold voltage, a breakdown voltage, and an on/off current ratio;
increasing the threshold voltage and the breakdown voltage of the MSM diode in response to increasing a first thickness of the Si semiconductor layer;
increasing both on and off currents of the MSN diode in response to decreasing the Si thickness below the first thickness; and,
decreasing both the on and off currents in response to increasing the Si thickness above the first thickness.

14. A method for forming a metal/semiconductor/metal (MSM) back-to-back Schottky diode from a silicon (Si) semiconductor, the method comprising:
depositing a Si semiconductor layer between a bottom electrode and a top electrode with a CVD process as follows:
flowing silane at a rate in the range of about 40 to 200 standard cubic centimeters (sccm);
heating the substrate to a temperature in the range of about 500 to 600° C.;
creating a deposition pressure in the range of about 150 to 250 milliTorr (mtorr); and,
depositing for a duration in the range of about 10 minutes to 6 hours;
forming a MSM diode having a threshold voltage, a breakdown voltage, and an on/off current ratio; and,
modifying the threshold voltage, the breakdown voltage, and the on/off current ratio of the MSM diode in response to controlling a thickness of the Si semiconductor layer.

15. A method for forming a metal/semiconductor/metal (MSM) back-to-back Schottky diode from a silicon (Si) semiconductor, the method comprising:
depositing a Si semiconductor layer selected from a group consisting of amorphous Si (a-Si) and polycrystalline Si (polySi) between a bottom electrode and a top electrode;
doping the Si semiconductor layer with a Group V donor material;
forming a MSM diode having a threshold voltage, a breakdown voltage, and an on/off current ratio;
modifying the threshold voltage, the breakdown voltage, and the on/off current ratio of the MSM diode in response to controlling a thickness of the Si semiconductor layer; and,
wherein modifying the threshold voltage, the breakdown voltage, and the on/off current ratio of the MSM diode includes decreasing the threshold voltage and increasing the breakdown voltage in response to increasing the doping the Si semiconductor layer.

* * * * *